(12) United States Patent
Lee

(10) Patent No.: US 6,239,641 B1
(45) Date of Patent: May 29, 2001

(54) DELAY LOCKED LOOP USING BIDIRECTIONAL DELAY

(75) Inventor: Joong Ho Lee, Cheongju (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/476,380

(22) Filed: Jan. 3, 2000

(30) Foreign Application Priority Data

Jul. 28, 1999 (KR) .................................................. 99-30900

(51) Int. Cl.[7] ..................................................... H03H 11/26
(52) U.S. Cl. ............................................. 327/270; 327/271
(58) Field of Search ...................................... 327/270, 271, 327/272, 274, 276, 277, 278, 280, 281, 284, 285, 287, 288, 393, 394, 395, 396, 400

(56) References Cited

U.S. PATENT DOCUMENTS 6,069,508 * 5/2000 Takai ..................................... 327/161

* cited by examiner

Primary Examiner—Toan Tran
Assistant Examiner—Linh Nguyen
(74) Attorney, Agent, or Firm—Morgan, Lewis & Bockius LLP

(57) ABSTRACT

A delay locked loop in accordance with the present invention includes: a first delay delaying an external clock signal; a first pulse generator receiving an output from the first delay, and generating a first input signal in a short-pulse shape; a second delay delaying an inverted external clock signal; a second pulse generator receiving an output from the second delay, and generating a second input signal in a short-pulse shape; a direction control unit generating first and second control signals in order to control a forward or backward delay of the first input signal or the second input signal in accordance with a level of the external clock signal; and a delay chain consisting of a plurality of unit delays having first and second inverters, and delaying the first input signal or the second input signal in the forward and backward directions through the first and second inverters in accordance with the first and second control signals outputted from the direction control unit. The DLL in accordance with the present invention alternately uses two input signals by employing the unit delays in the case that the external clock signal is at a high level and at a low level, thereby improving efficiency of the bidirectional delay.

20 Claims, 5 Drawing Sheets

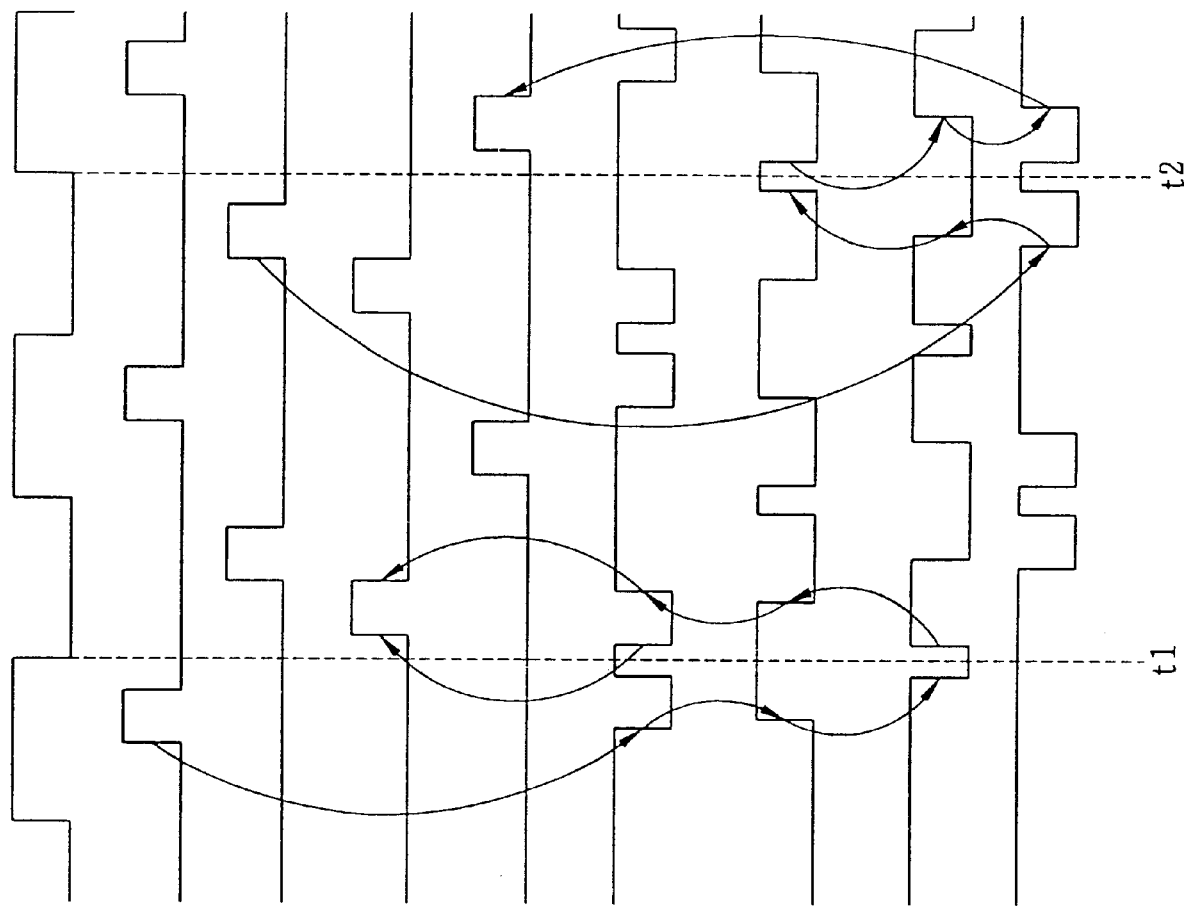

DELAY LOCKED LOOP USING BIDIRECTIONAL DELAY

BACKGROUND OF THE INVENTION

1. Field of the Invention

The present invention relates to a synchronous dynamic random access memory DRAM, and in particular to a delay locked loop DLL using a bidirectional delay.

2. Description of the Background Art

FIG. 1 illustrates a conventional synchronous mirror delay SMD used for a synchronous dynamic random access memory DRAM.

As shown therein, an one-shot pulse generator 10 receives an external clock signal CLKext, and generates an input clock signal CLKin having an one-shot pulse shape. A first delay unit 12 delays the input clock signal CLKin for a predetermined time d1+d2+dt. Here, the delay time d1+d2+dt by the first delay unit 12 is equal to a sum of the delay times by a mirror control circuit 16 and a second delay unit 22 to be described later.

A forward delay array 14 includes a plurality of unit delays consisting respectively of a NAND gate and an inverter. The forward delay array sequentially delays a clock signal FDAin outputted from the first delay unit 12, and outputs a plurality of delay clock signals FDA1~FDAn. One input of the NAND gate in each of the unit delays is fixed at the VCC level and the other input of the NAND gate is an output of the previous unit delay.

The mirror control circuit 16 consists of a plurality of NAND gates. The mirror control circuit 16 compares the input clock signal CLKin with the plurality of delay clock signals FDA1~FDAn outputted from the forward delay array 14, respectively, and generates pulse signals G1~Gn having an identical pulse width to the input clock signal CLKin at a point where the phases of the two clock signals are identical.

A backward delay array 18 has the same size and constitution as the forward delay array 14, delays the pulse signals G1~Gn generated from the mirror control circuit 16 in the backward direction for the time which the pulse signal has been generated, and outputs a clock signal BDAout having an identical phase to the input signal FDAin of the forward delay array 14.

A dummy load 20 is a load added so that the forward delay array 14 and the mirror control circuit 16 can be symmetric to the backward delay array 18 and a dummy load 20. The second delay unit 22 delays the clock signal BDAout outputted from the backward delay array 18 for a time d2, and outputs an internal clock signal CLKint having a phase identical to or faster than the input clock signal CLKin.

The operation of the conventional synchronous mirror delay SMD will now be described.

When the clock signal CLKext as shown in FIG. 2A is externally inputted, the one-shot pulse generator 10 generates the input clock signal CLKin as shown in FIG. 2B. The generated input clock signal CLKin is delayed in the first delay for a predetermined time d1+d2+dt, and becomes the input clock signal FDAin of the forward delay array 14, as shown in FIG. 2C.

The forward delay array 14 sequentially delays the clock signal FDAin through the unit delays thereof. The mirror delay circuit 16 sequentially compares the input clock signal CLKin outputted from the one-shot pulse generator 10 with the plurality of delay clock signals FDA1~FDAn outputted from the backward delay array 14, and generates the pulse signals G1~Gn at a point where the phases of the two clock signals are identical.

For example, it is presumed that the delay clock signal FDAi outputted from the i-th unit delay of the forward delay array 14, as shown in FIG. 2D, is synchronized with the input clock signal CLKin. Here, the i-th NAND gate of the mirror delay circuit 16 generates the pulse signal Gi having an identical pulse width to the input clock signal CLKin, as shown in FIG. 2E, and the outputs from the other NAND gates are at a high level. Accordingly, the pulse signal Gi proceeds in the backward direction from a synchronization point (the inverter of the i-th unit delay) through the backward delay array 18. However, since the pulse signal Gi is delayed more than the clock signal FDAin by the time tDA, a rising edge of the pulse signal Gi appears at a very lagging time, as compared with that of the external clock signal CLKext. As a result, the pulse signal Gi cannot be used as an internal clock signal CLKint for the system.

Accordingly, if the pulse signal Gi generated from the mirror delay circuit 16 is delayed for the time tDA through the backward delay array 18, the clock signal BDAout as shown in FIG. 2F is generated. Therefore, by setting a delay so that a delay of the second delay unit 22 is set smaller than a delay d2 of the unit delay, the internal clock signal CLKint having a faster phase than the external clock signal CLKext can be obtained from the clock signal BDAout.

Here, the delay of the second delay 22 is set to be d2 so that the delay time d1+d2+dt by the first delay unit 12 can be offset by the delay times of a last NAND gate of the mirror control circuit 16 and the second delay unit 22. Accordingly, as illustrated in FIG. 2G, the internal clock signal CLKint synchronized with the external clock signal CLKext is generated from the second delay unit 22, thereby being used as an internal signal for the system.

However, the conventional synchronous mirror delay SMD must be additionally provided with the backward delay array having an identical size to the forward delay array in order to generate a final clock signal synchronized with the external clock signal. As a result, the conventional synchronous mirror delay SMD has a disadvantage in that an area of the circuit is increased due to the added backward delay array.

In addition, in the conventional synchronous mirror delay SMD, increases power consumption by the added backward delay array. This phenomenon is serious in a standby mode where the synchronous mirror delay SMD must be at an operational state.

SUMMARY OF THE INVENTION

An object of the present invention is to provide a delay locked loop DLL which can considerably reduce a circuit area and power consumption.

In order to achieve the above-described object of the present invention, there is provided a delay locked loop DLL including: a first delay delaying an external clock signal; a first pulse generator receiving an output from the first delay, and generating a first input signal in a short-pulse shape; a second delay delaying an inverted external clock signal; a second pulse generator receiving an output from the second delay, and generating a second input signal in a short-pulse shape; a direction control unit generating first and second control signals in order to control a forward and backward delay of the first input signal or the second input signal in accordance with a level of the external clock signal; and a delay chain consisting of a plurality of unit delays having first and second inverters complimentarily operated in accordance with the first and second control signals, and delaying the first input signal or the second input signal in the forward or backward direction through the first and second inverters.

The delay chain delays the first input signal in the forward direction through the first inverters when the external clock signal is at a high level, and. delays the transmitted first input signal in the backward direction through the second inverters when the external clock signal is at a low level. In addition, the delay chain delays the second input signal in the forward direction through the second inverters when the external clock signal is at a low level, and delays the transmitted second input signal in the backward direction through the first inverters when the external clock signal is at a high level.

BRIEF DESCRIPTION OF THE DRAWINGS

The present invention will become better understood with reference to the accompanying drawings which are given only by way of illustration and thus are not limitative of the present invention, wherein:

FIGS. 5A to 5I are waveform diagrams in FIG. 3, showing an example that a first input signal proceeds in the forward direction and then proceeds in the backward direction in the unit delay 100-(n-1), and showing an example that a second input signal proceeds in the forward direction and then proceeds in the backward direction in the unit delay 100-2.

DETAILED DESCRIPTION OF THE INVENTION

A delay locked loop in accordance with the present invention (hereinafter, referred to as 'DLL') is designed to have a smaller circuit area by removing a mirror control circuit and a dummy load from a conventional DLL, and by constituting a forward delay array and a backward delay array in a different method. In addition, the DLL in accordance with the present invention is characterized by bidirectional flowing of signals, differently from a conventional synchronous mirror delay SMD or negative delay circuit NDC having single directional flowing of signals.

Figure 1:
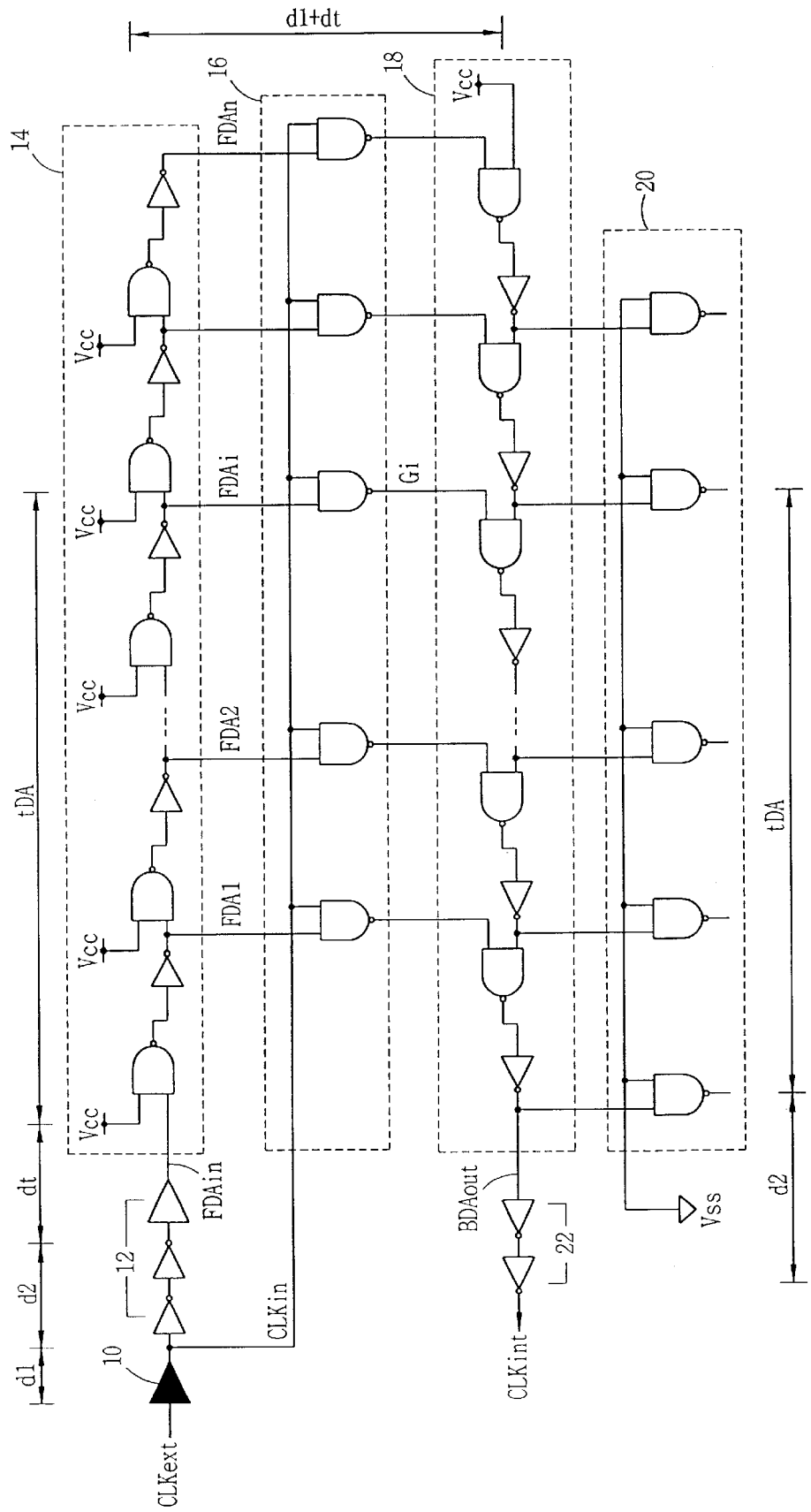
FIG. 1 is a circuit diagram illustrating a conventional synchronous mirror delay SMD used for a synchronous dynamic random access memory DRAM.
Figure 2:
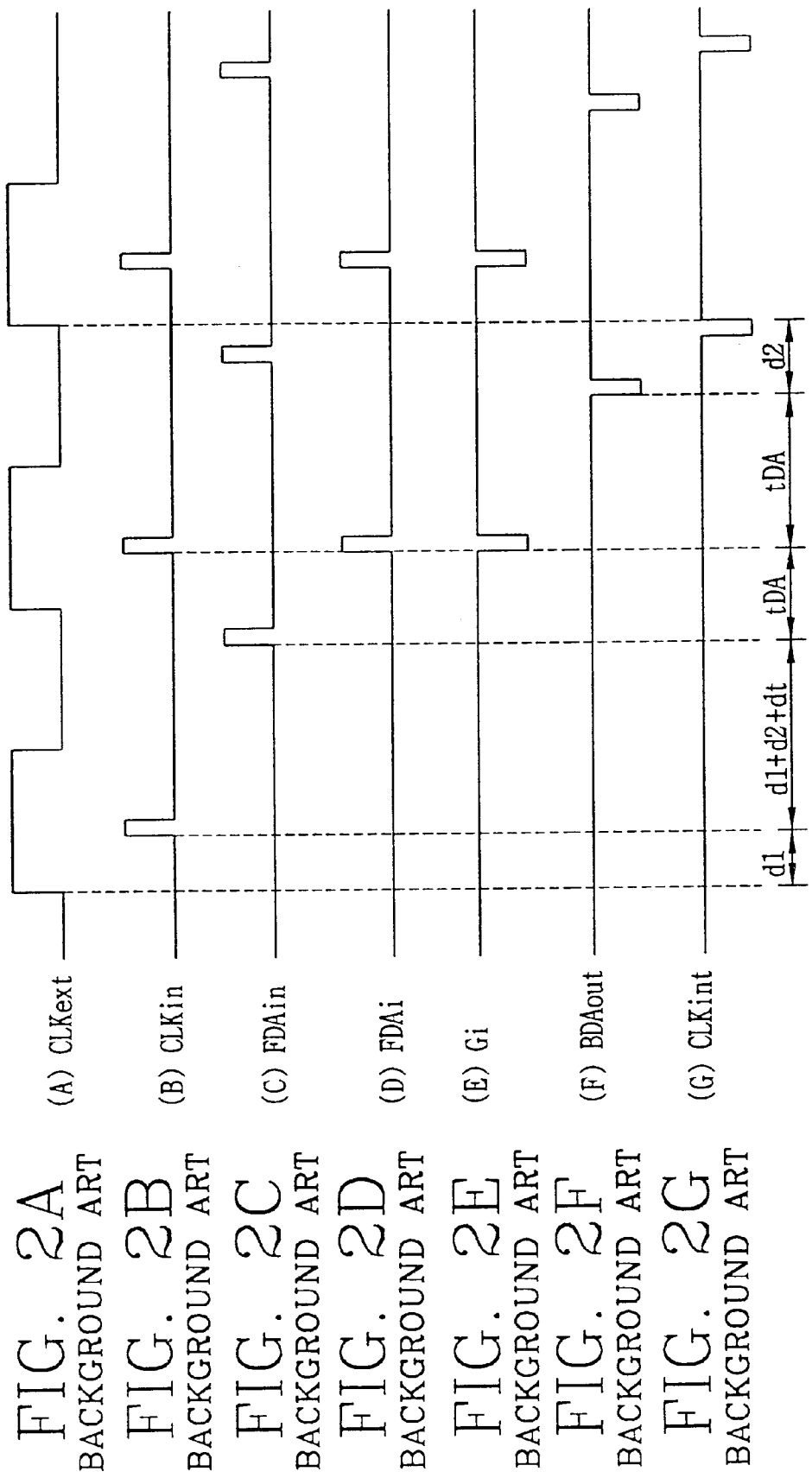
FIGS. 2A to 2G are waveform diagrams illustrating input and output signals of each unit generating an internal clock signal circuit in FIG. 1.
Figure 3:
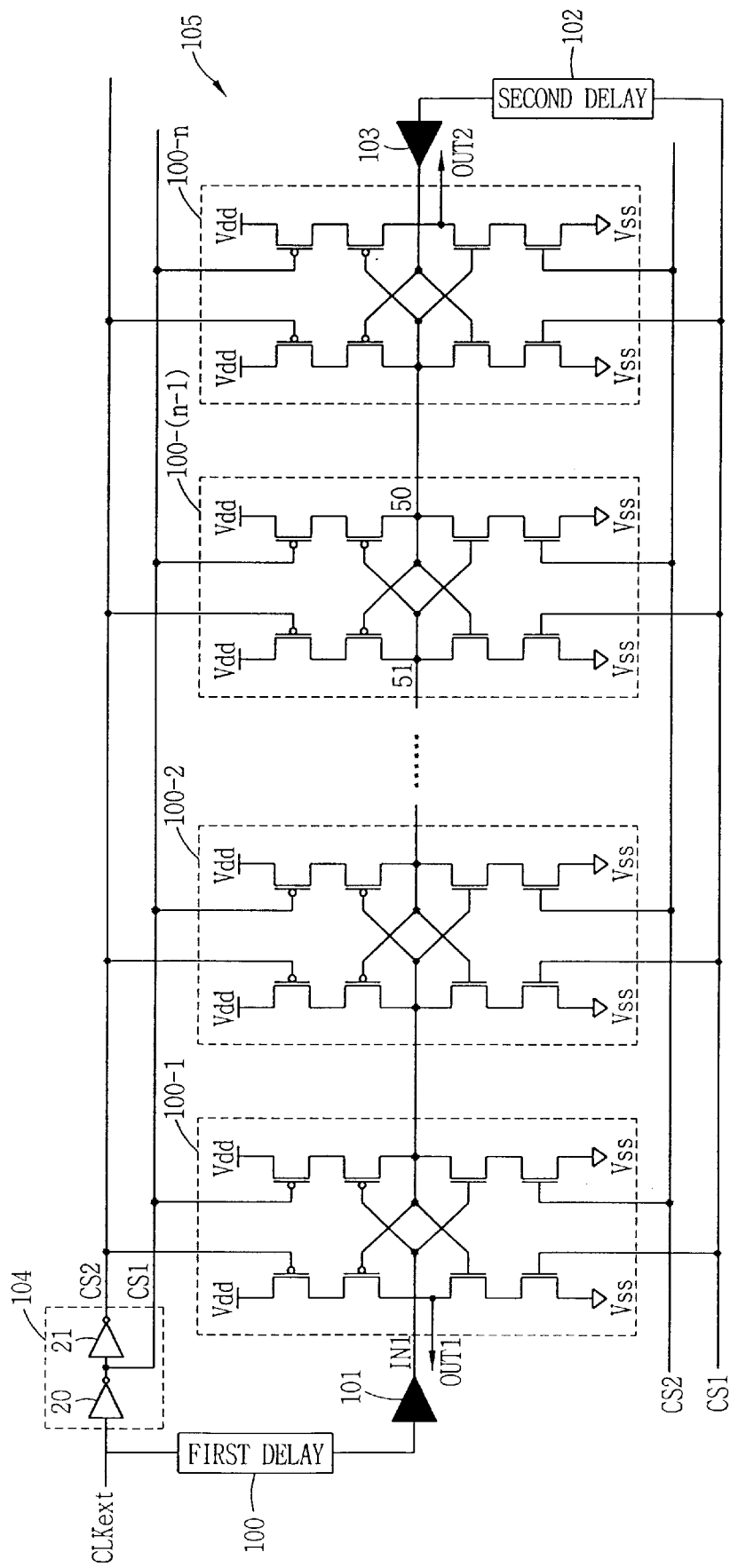
FIG. 3 is a circuit diagram illustrating a delay locked loop DLL using a bidirectional delay in accordance with the present invention.

FIG. 3 illustrates the DLL having the bidirectional flowing of signals in accordance with the present invention. As shown therein, the DLL in accordance with the present invention includes: a first delay 100 delaying an external clock signal CLKext; a first pulse generator 101 receiving an output from the first delay 100, and generating a first input signal IN1 having a short pulse shape; a second delay 102 delaying an inverted external clock signal CLKext; a second pulse generator 103 receiving an output from the second delay 102, and generating a second input signal IN2 having a short pulse shape; a direction control unit 104 generating first and second control signals CS1, CS2 to control a forward or backward delay of the first input signal IN1 or the second input signal IN2 in accordance with a level of the external clock signal CLKext; and a delay chain 105 delaying the first input signal IN1 or the second input signal IN2 in the forward or backward direction in accordance with the first and second control signals CS1, CS2 outputted from the direction control unit 104.

The first delay 100 and the first pulse generator 101 are identical to the second delay 102 and the second pulse generator 103, respectively. The direction control unit 104 consists of inverters 20, 21 sequentially inverting the external clock signal CLKext, and outputting the first and second control signals CS1, CS2.

The delay chain 105 consists of a plurality of unit delays 100-1~100-n. The respective unit delays consist of two clocked inverters (hereinafter, referred to as 'inverter') controlled by the first and second control signals CS1, CS2. Here, the two inverters are complimentarily operated and each inverter consists of two PMOS transistors and two NMOS transistors which are connected between the power supply voltage VDD and the ground.

Figure 4:
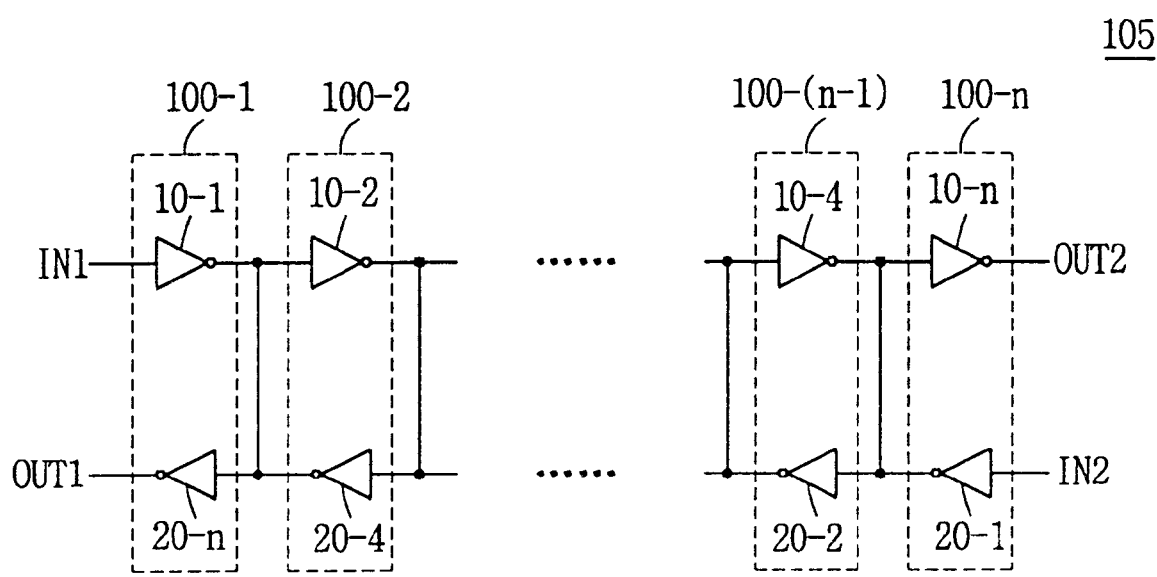
FIG. 4 is a functional diagram illustrating a plurality of unit delays in FIG. 3.

FIG. 4 illustrates a functional diagram of the delay chain 105. Two inverters 10-1, 20-n correspond to the unit delay 100-1 in FIG. 3, and two inverters 10-2, 20-(n-1) correspond to the delay unit 100-2. In the same manner, two inverters 10-n, 20-1 correspond to the unit delay 100-n. In addition, an output terminal of the inverter 10-1 is connected to an input terminal of the inverter 20-n in the first unit delay 100-1, and an output terminal of the inverter 20-1 is connected to an input terminal of the inverter 10-n in the last unit delay 100-n. Input/output terminals of the inverters are respectively connected to output/input terminals of corresponding inverters in the remaining unit delays 100-2~100-(n-1).

The operation of the DLL having the bidirectional flowing of signals in accordance with the present invention will now be described.

① When the external clock signal CLKext is at a high level,

When the high-level clock signal CLKext is inputted, the first input signal IN1 having a short pulse shape is inputted through the first delay 100 and the pulse generator 101. The direction control unit 104 sequentially inverts the external clock signal CLKext, and outputs the first and second control signals CS1, CS2 at low and high levels to the delay chain 105.

As a result, the inverters 10-1·10-n and the inverters 20-1~20-n of the unit delays 100-1~100-n are enabled and disabled respectively according to the first and second control signals CS1, CS2. The first input signal IN1 is sequentially transmitted from the unit delay 100-1 to the succeeding unit delays 100-2~100-n.

Thereafter, if the external clock signal CLKext becomes a low level, the first and second control signals CS1, CS2 outputted from the direction control unit 104 become a high level and a low level, respectively. Accordingly, the inverters 101 1~10-n of the unit delays 100-1~100-n are disabled and the inverters 20-1~20-n thereof are enabled. Thus, the first input signal IN1 proceeding in the forward direction is stopped and then proceeds in the backward direction through the enabled inverters 20-1~20-n. Consequently, a first output signal OUT1 having an identical pulse width to the first input signal IN1 and having a faster phase than the external clock signal CLKext is generated through the output terminal of the unit delay 100-1.

② When the external clock signal CLKext is at a low level,

When the low-level clock signal CLKext is inputted, the second input signal IN2 having a short pulse shape is generated through the second delay 102 and the second pulse generator 103. The direction control unit 104 outputs the first and second control signals CS1, CS2 at high and low levels to the delay chain 105. As a result, the inverters 20-1~20-n of the unit delays 100-1~100-n are enabled, and the inverters 10-1~10-n thereof are disabled in accordance with the first and second control signals CS1, CS2. The second input signal IN2 is sequentially transmitted from the unit delay 1 00-n to the succeeding unit delays 100-2~100-n(n-1).

Thereafter, when the external clock signal CLKext becomes a high level, the first and second control signals CS1, CS2 outputted from the direction control unit 104 become low and high levels, respectively. Thus, the inverters 20-1~20-n of the unit delays 100-1~100-n are disabled, and the inverters 10-1~10-n thereof are enabled. Accordingly, the second input signal IN2 proceeding in the forward direction is stopped and then proceeds in the backward direction through the enabled inverters 10-1~10-n. As a result, a second output signal OUT2 having an identical pulse width to the second input signal IN2 and having a faster phase than the external clock signal CLKext is generated.

FIGS. 5A to 5I show a waveform illustrating an example that the first input signal IN1 proceeds in the forward direction and then proceeds in the backward direction in the unit delay 100-(n-1). Also, FIGS. 5A to 5I show a waveform illustrating an example that the second input signal IN2 proceeds to the unit delay 100-2 and then proceeds in the backward direction from the unit delay 100-2. The operation of the DLL in accordance with the present invention will now be explained with reference to FIGS. 5A to 5I.

When the high-level external clock signal CLKext as shown in FIG. 5A is inputted, the first input signal IN1 delayed for a predetermined time as shown FIG. 5B is generated through the first delay 100 and the first pulse generator 101. At this time, the direction control unit 104 receives the high-level external clock signal CLKext and outputs the first and second control signals CS1, CS2 at low and high levels. As a result, the right-side inverters of each unit delay 100-1~100-n are enabled, and the left-side inverters thereof are disabled. Accordingly, as illustrated in FIGS. 5F and 5G, the first input signal IN1 is sequentially transmitted from the unit delay 100-1 to the succeeding unit delays 100-2~100-n, and thus a signal applied to an output terminal 50 of the unit delay 100-(n-1) is transited to a low level as shown in FIG. 5H.

Thereafter, if the external clock signal CLKext becomes a low level at the time t1, the right-side inverters of the respective unit delays 100-1~100-n are disabled, and the left-side inverters thereof are enabled according to the first and second control signals CS1, CS2. Consequently, the low-level signal at the output terminal 50 of the unit delay 100-(n-1) is applied to the left-side inverters, and thus a signal at an output terminal 51 becomes a high level as shown in FIG. 5H. Accordingly, the signal at the output terminal 51 is sequentially delayed in the backward direction through the left-side inverters of each unit delay, and thus the first output signal OUT1 as shown in FIG. 5D is generated from the output terminal of the unit delay 100-1.

When the low-level external clock signal CLKext is inputted, the second input signal IN2 as shown in FIG. 5C proceeds in the forward direction from the unit delay 100-n to the unit delay 100-2. Thereafter, the external clock signal CLKext becomes a high level at the time t2, an output signal from the unit delay 100-2 proceeds in the backward direction again, and thus the second output signal OUT2 as shown in FIG. 5E is generated through an output terminal of the unit delay 100-n. Accordingly, the first and second output signals OUT1, OUT2 are used as internal signals CLKint.

As discussed earlier, the DLL in accordance with the present invention alternately uses the two input signals by employing the identical unit delays in the case that the external clock signal is at a high level and at a low level, thereby improving efficiency of the bidirectional delay more than two times.

In addition, the DLL in accordance with the present invention removes the dummy load and the mirror control circuit MCC, and newly designs the forward delay array FDA and the backward delay array BDA, thereby overcoming an area overhead which is the main disadvantage of the conventional DLL.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A delay locked loop using a bidirectional delay, comprising:

a first delay for delaying a first signal;

a first pulse generator for receiving an output from the first delay, and for generating a first input signal;

a second delay for delaying a second signal;

a second pulse generator for receiving an output from the second delay, and for generating a second input signal;

a direction control unit for generating first and second control signals in order to control a delay direction in accordance with a level of the first signal; and a delay chain for delaying the first input signal or the second input signal in the forward and backward direction in accordance with the first and second control signals outputted from the direction control unit.

2. The delay locked loop according to claim 1, wherein the first signal is an external clock signal, and the second signal is an inverted external clock signal.

3. The delay locked loop according to claim 1, wherein the first and second input signals are short pulse signals.

4. The delay locked loop according to claim 3, wherein the first input signal is generated when the first signal is at a high level, and the second input signal is generated when the second signal is at a low level.

5. The delay locked loop according to claim 1, wherein the first control signal is an inverted signal of the first signal, and the second control signal is an inverted signal of the first control signal.

6. The delay locked loop according to claim 1, wherein the first and second delays have an identical delay rate.

7. The delay locked loop according to claim 1, wherein the delay chain consists of a plurality of unit delays having two inputs and two outputs in order to delay the first input signal or the second input signal in the forward and backward directions, and each unit delay consists of first and second inverters complimentarily operated in accordance with first and second control signals.

8. The delay locked loop according to claim 7, wherein the delay chain delays the first input signal in the forward direction through the first inverters when the first signal is at a high level, and delays the transmitted first input signal in the backward direction through the second inverters when the first signal is at a low level.

9. The delay locked loop according to claim 7, wherein the delay chain delays the second input signal in the forward direction through the second inverters when the second signal is at a low level, and delays the transmitted second input signal in the backward direction through the first inverters when the second signal is at a high level.

10. The delay locked loop according to claim 7, wherein the first inverter consists of a first to the fourth MOS transistors which are connected in series between the power supply voltage and the ground, and the second inverter consists of a fifth to the eighth MOS transistors which are connected in series between the power supply voltage and the ground.

11. The delay locked loop according to claim 10, wherein the first, second, fifth and sixth MOS transistors are PMOS transistors, and the third, fourth, seventh and eighth MOS transistors are NMOS transistors.

12. The delay locked loop according to claim 10, wherein the first and eighth transistors are controlled by the second control signal, and the fourth and fifth MOS transistors are controlled by the first control signal.

13. The delay locked loop according to claim 7, wherein an output terminal of the first inverter in the first unit delay is connected to an input terminal of the second inverter, and an output terminal of the second inverter is connected to an input terminal of the first inverter in the last unit delay.

14. The delay locked loop according to claim 7, wherein input/output terminals of the first inverters are connected to output/input terminals of the second inverters in the plurality of unit delays except for the first and last unit delays.

15. The delay locked loop using a bidirectional delay, comprising:

a first pulse generator for delaying an external clock signal, and for generating a first input signal having a short pulse shape;

a second pulse generator for delaying an inverted external clock signal, and for generating a second input signal in a short pulse shape;

a direction control unit for receiving the external clock signal, and for generating first and second control signals in order to control a delay direction; and a plurality of unit delays for delaying the first input signal or the second input signal in the forward and backward directions in accordance with the first and second control signals from the direction control unit.

16. The delay locked loop according to claim 15, wherein the plurality of unit delays include two inputs and two outputs, respectively, and each unit delay consists of first and second inverters complimentarily operated in accordance with the first and second control signals.

17. The delay locked loop according to claim 16, wherein the first inverters of the plurality of unit delays delay the first input signal in the forward direction when the external clock signal is at a high level, and the transmitted first input signal is delayed in the backward direction via the second inverters when the external clock signal is at a low level.

18. The delay locked loop according to claim 16, wherein the second inverters of the plurality of unit delays delay the second input signal in the forward direction when the external clock signal is at a low level, and the transmitted second input signal is delayed in the backward direction via the first inverters when the external clock signal is at a low level.

19. The delay locked loop according to claim 16, wherein an output terminal of the first inverter in the first unit delay is connected to an input terminal of the second inverter in the first unit delay, and an output terminal of the second inverter in the last unit delay is connected to an input terminal of the first inverter in the last unit delay.

20. The delay locked loop according to claim 16, wherein input/output terminals of the first inverters are connected to output/input terminals of the second inverters in the plurality of unit delays except for the first and last unit delays.

* * * * *